United States Patent
Ouderkirk et al.

(10) Patent No.: US 10,741,735 B2
(45) Date of Patent: Aug. 11, 2020

(54) LED WITH REMOTE PHOSPHOR AND SHELL REFLECTOR

(71) Applicant: 3M INNOVATIVE PROPERTIES COMPANY, St. Paul, MN (US)

(72) Inventors: Andrew J. Ouderkirk, St. Paul, MN (US); Erin A. McDowell, Afton, MN (US); Nicholas T. Gabriel, Woodbury, MN (US); Bill H. Dodge, Finlayson, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 299 days.

(21) Appl. No.: 15/311,903

(22) PCT Filed: May 22, 2015

(86) PCT No.: PCT/US2015/032104
§ 371 (c)(1),
(2) Date: Nov. 17, 2016

(87) PCT Pub. No.: WO2015/187388
PCT Pub. Date: Dec. 10, 2015

(65) Prior Publication Data
US 2017/0084799 A1 Mar. 23, 2017

Related U.S. Application Data

(60) Provisional application No. 62/006,452, filed on Jun. 2, 2014.

(51) Int. Cl.
*H01L 33/00* (2010.01)
*H01L 33/50* (2010.01)
(Continued)

(52) U.S. Cl.
CPC ........ *H01L 33/507* (2013.01); *H01L 25/0753* (2013.01); *H01L 33/502* (2013.01);
(Continued)

(58) Field of Classification Search
CPC ..... H01L 33/507; H01L 33/56; H01L 33/641; H01L 33/502; H01L 33/54; H01L 33/60;
(Continued)

(56) References Cited

U.S. PATENT DOCUMENTS 5,882,774 A 3/1999 Jonza
6,783,349 B2 8/2004 Neavin
(Continued)

FOREIGN PATENT DOCUMENTS

EP 1756879 2/2007
EP 1885003 2/2008
(Continued)

OTHER PUBLICATIONS

International Search Report for PCT International Application No. PCT/US2015/032104, dated Aug. 17, 2015, 3 pages.

*Primary Examiner* — Robert G Bachner
(74) *Attorney, Agent, or Firm* — Clifton F. Richardson

(57) ABSTRACT

The present disclosure provides a configuration and technique of fabricating remote phosphor optics (such as lenses) for downconverting LEDs, replacing the prior art solid hemispherical lenses with a novel thin-shell hemispherical lens that can be used with a wide range of encapsulating materials, including low index materials such as air and methyl silicones. The present disclosure further provides a configuration and technique whereby the remote phosphor lenses can be used with an LED array.

11 Claims, 7 Drawing Sheets

(51) Int. Cl.
*H01L 25/075* (2006.01)
*H01L 33/54* (2010.01)
*H01L 33/56* (2010.01)
*H01L 33/60* (2010.01)
*H01L 33/64* (2010.01)
*H01L 33/44* (2010.01)

(52) U.S. Cl.
CPC .............. *H01L 33/54* (2013.01); *H01L 33/56* (2013.01); *H01L 33/60* (2013.01); *H01L 33/641* (2013.01); *H01L 33/44* (2013.01); *H01L 2924/0002* (2013.01)

(58) Field of Classification Search
CPC ......... H01L 25/0753; H01L 2924/0002; H01L 33/44
See application file for complete search history.

(56) References Cited

U.S. PATENT DOCUMENTS

| | | |
|---|---|---|
| 6,967,778 B1 | 11/2005 | Wheatley |
| 7,798,678 B2 | 9/2010 | Destain |
| 2004/0144987 A1 | 7/2004 | Ouderkirk |
| 2007/0152231 A1 | 7/2007 | Destain |
| 2009/0001399 A1 | 1/2009 | Diana |
| 2009/0046459 A1* | 2/2009 | Ijzerman ................ F21V 7/06 362/240 |
| 2010/0047941 A1 | 2/2010 | Lee |
| 2010/0327308 A1* | 12/2010 | Park ..................... B29C 39/025 257/98 |
| 2011/0317431 A1* | 12/2011 | Ikenaga ................. C03B 11/10 362/311.05 |
| 2012/0025216 A1* | 2/2012 | Kolodin ................ C09K 11/02 257/88 |
| 2013/0020590 A1* | 1/2013 | Lin ....................... H01L 33/60 257/88 |
| 2013/0083521 A1 | 4/2013 | Fang |
| 2014/0217433 A1* | 8/2014 | Tudorica ............ H01L 25/0753 257/89 |

FOREIGN PATENT DOCUMENTS

| | | | | |
|---|---|---|---|---|
| KR | 10-2008-0081085 | | 9/2008 | |
| WO | WO 2000-065664 | | 11/2000 | |
| WO | WO 2002-069409 | | 9/2002 | |
| WO | WO 2004-068552 | | 8/2004 | |
| WO | WO 2008-016908 | | 2/2008 | |
| WO | WO 2010-068886 | | 6/2010 | |
| WO | WO 2012-091971 | | 7/2012 | |
| WO | WO 2012-091973 | | 7/2012 | |
| WO | WO 2013-055412 | | 4/2013 | |
| WO | WO 2013-180890 | | 12/2013 | |
| WO | WO 2014-042706 | | 3/2014 | |
| WO | WO-2014/042706 | * | 3/2014 | .......... H01L 33/48 |
| WO | WO 2014/042706 A1 | * | 3/2014 | .......... H01L 33/48 |
| WO | WO 2015-009811 | | 1/2015 | |
| WO | WO 2015-100065 | | 2/2015 | |

* cited by examiner

ID: 10,741,735 B2

LED WITH REMOTE PHOSPHOR AND SHELL REFLECTOR

BACKGROUND

White light emitting diodes (LEDs) are commonly produced by converting a portion of the output of a blue LED to longer wavelengths, and combining the remaining blue light with the down-converted light to make white light. The down-conversion is usually achieved using a phosphor that coats the emitting surface of the blue LED die. This configuration of down-converting phosphor and LED die is referred to as a direct phosphor configuration.

Direct phosphor configurations can have several drawbacks. The configuration increases both the LED and the phosphor temperature, which can reduce both the efficiency and the lifetime of each of the components. Further, about half of the light emitted by the phosphor can re-enter the LED die, and due to the relatively low reflectivity and absorption in the die, the system efficiency can be further reduced.

A promising alternative to the direct phosphor configuration is the remote phosphor configuration. Remote phosphors fall into two broad categories: reflective and transmissive. Transmissive remote phosphor LEDs have one or more LED die that illuminates a phosphor containing layer, where the phosphor layer is positioned at distance from the LED die. Normally, the LED die are spaced from each other and are bonded to a highly reflective substrate. Reflective remote phosphor configurations have one or more die illuminating a phosphor coated reflective surface, where the combination of light reflecting from the phosphor layer along with the converted light form white light.

Both the reflective and transmissive remote phosphor configurations substantially increase the emitting area of the LED, increase the amount of phosphor, and thereby increase etendue, which is undesirable in applications where the light will be directed with lenses and mirrors.

SUMMARY

The present disclosure provides a configuration and technique of fabricating remote phosphor optics (such as lenses) for downconverting LEDs, replacing the prior art solid hemispherical lenses with a novel thin-shell hemispherical lens that can be used with a wide range of encapsulating materials, including low index materials such as air and methyl silicones. The present disclosure further provides a configuration and technique whereby the remote phosphor lenses can be used with an LED array. In one aspect, the present disclosure provides a lamp that includes a light emitting diode (LED) disposed on a substrate; a light conversion material adjacent the LED; and a light transmissive shell. The light transmissive shell includes an exterior convex surface; an interior concave surface; and an edge extending from the interior concave surface, the edge attached to the substrate and enclosing the LED and the light conversion material within a volume between the interior concave surface and the substrate. The lamp further includes a dichroic coating disposed on at least one of the exterior convex surface or the interior concave surface, wherein the dichroic coating is reflective to a first wavelength range of light emitted by the LED, and transmissive of other wavelength ranges of light.

In another aspect, the present disclosure provides a lamp that includes at least two light emitting diodes (LEDs) disposed on a substrate; a light conversion material adjacent to each of the at least two LEDs; and a sheet having a light transmissive shell aligned with each of the at least two LEDs. Each light transmissive shell includes an exterior convex surface; an interior concave surface; and an edge extending from the interior concave surface, the edge attached to the substrate and enclosing each LED and adjacent light conversion material within a volume between the interior concave surface and the substrate. The lamp further includes a dichroic coating disposed on at least one of the exterior convex surface or the interior concave surface, wherein the dichroic coating is reflective to a first wavelength range of light emitted by the LED, and transmissive of other wavelength ranges of light.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
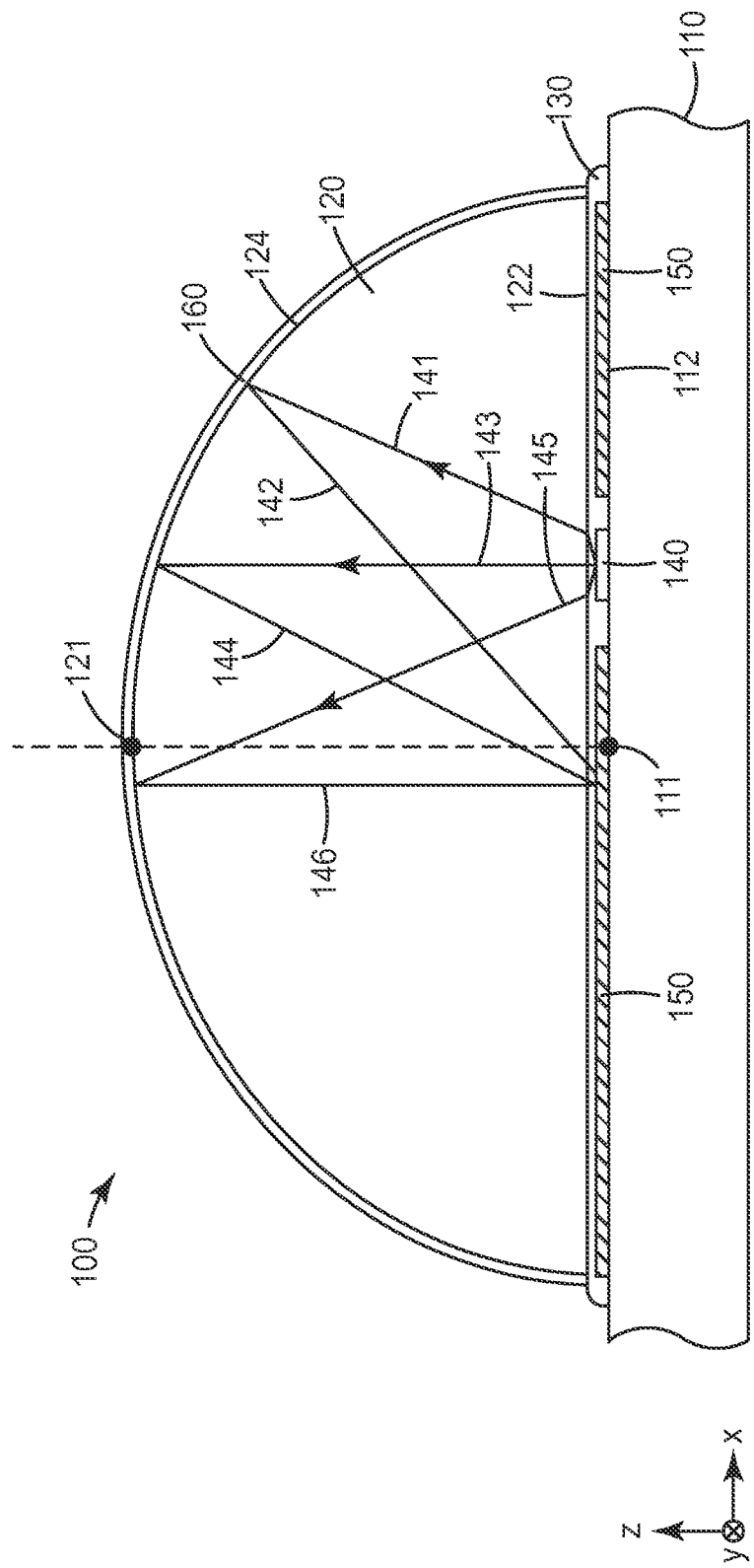
FIG. 1A shows a schematic cross-sectional view of a prior art remote phosphor LED device.

The present disclosure provides a configuration and technique of fabricating remote phosphor optics (such as lenses) for downconverting LEDs, replacing the prior art solid hemispherical lenses with a novel thin-shell hemispherical lens that can be used with a wide range of encapsulating materials, including low index materials such as air and methyl silicones. The present disclosure further provides a configuration and technique whereby the remote phosphor lenses can be used with an LED array. This configuration can significantly increase the value of the lenses to the LED packager. Remote phosphor technology can meet all of the color and performance requirements commonly specified in lighting applications, and combines the low phosphor usage and high brightness of direct LEDs with the high efficiency and excellent thermal management of remote phosphor LEDs.

3M Company developed a remote phosphor configuration that uses a reflective hemispherical lens to image light emitted from a die to an area of phosphor adjacent to the die, as described, for example, in co-pending PCT Publication Nos. WO2012/091971 entitled REMOTE PHOSPHOR LED CONSTRUCTIONS, and also WO2012/091073 entitled REMOTE PHOSPHOR LED DEVICE WITH BROADBAND OUTPUT AND CONTROLLABLE COLOR. In one particular embodiment of these publications, light from the phosphor is combined with light from the die to form white light. The described 3M remote phosphor configurations have excellent color uniformity, low system etendue, low phosphor usage, and high efficiency.

The remote phosphor configuration describes broadband solid state light sources that utilize a phosphor layer or material that is pumped or excited by light from one or more LEDs. The sources also include a dichroic reflector that reflects at least some of the LED light onto the layer of phosphor. As light travels from the LED to the dichroic reflector, it does not pass through the phosphor layer. In some cases, the LED emits blue light, and the dichroic reflector reflects a first portion of the blue LED light onto the phosphor layer, the dichroic reflector also transmitting a second portion of the blue LED light. The transmitted blue LED light combines with longer wavelength light emitted by the phosphor, which is also transmitted by the dichroic reflector, to provide a broadband output beam, e.g., light having a white appearance. In some cases, the LED and/or the phosphor can be disposed on a flexible substrate having a cavity region and a neighboring region, the LED and/or phosphor being mounted or attached to the substrate in the cavity region. The flexible substrate includes a dielectric layer, which is thinner in the cavity region than in the neighboring region.

As mentioned above, the present application describes broadband solid state light sources that utilize a phosphor layer or material that is pumped or excited by light from one or more LEDs. The sources also include a dichroic reflector that reflects at least some of the LED light onto the layer of phosphor. As light travels from the LED to the dichroic reflector, it does not pass through the phosphor layer. In some cases, the LED emits blue light, and the dichroic reflector reflects a first portion of the blue LED light onto the phosphor layer, the dichroic reflector also transmitting a second portion of the blue LED light. The transmitted blue LED light combines with longer wavelength light emitted by the phosphor, which is also transmitted by the dichroic reflector, to provide a broadband output beam, e.g., light having a white appearance. In some cases, the LED and/or the phosphor are disposed on a flexible substrate having a cavity region and a neighboring region, the LED and/or phosphor being mounted or attached to the substrate in the cavity region. The flexible substrate includes a dielectric layer, which is thinner in the cavity region than in the neighboring region.

The reflective hemispherical lens can be produced by coating the outside of a sphere, and converting the sphere to the desired hemispherical shape. This produces a dimensionally, mechanically, and optically stable lens. In some applications, especially those that have very tight tolerances on color uniformity as a function of angle, the refractive index of the reflective hemispherical lens should be similar to the refractive index of the material bonding the lens to the LED die. This restriction limits the use of very low index encapsulating materials such as methyl silicones and air. In contrast, the present disclosure provides for a thin-shell hemispherical lens that replaces the solid reflective hemispherical lens described above, to enable the use of low index encapsulating materials.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

As used herein, "have", "having", "include", "including", "comprise", "comprising" or the like are used in their open ended sense, and generally mean "including, but not limited to." It will be understood that the terms "consisting of" and "consisting essentially of" are subsumed in the term "comprising," and the like.

As used herein, "light emitting diode" or "LED" refers to a diode that emits light, whether visible, ultraviolet, or infrared. It includes incoherent encased or encapsulated semiconductor devices marketed as "LEDs", whether of the conventional or super radiant variety. An "LED die" is an LED in its most basic form, i.e., in the form of an individual component or chip made by semiconductor processing procedures. For example, the LED die may be formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can also be used, as well as inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant over an LED die and an associated reflector cup. An "LED" for purposes of this application should also be considered to include organic light emitting diodes, commonly referred to as OLEDs.

All disclosed embodiments of broadband solid state light sources that utilize blue light-emitting LEDs may or may not also utilize flexible substrates, and all disclosed embodiments that utilize flexible substrates may or may not also utilize blue-light emitting LEDs. Further, as used herein, it is to be understood that the LEDs that emit light that can be downconverted by the phosphor after reflection from the dichroic reflector, can include blue-light emission, ultraviolet-light emission, or a combination thereof. The emission is downconverted by the phosphor to a longer wavelength of light.

FIG. 1A shows a schematic cross-sectional view of a prior art remote phosphor LED device 100. The prior art remote phosphor LED device 100 includes a blue-light emitting LED 140 and a phosphor layer 150 disposed on a first major surface 112 of a substrate 110. A hemispherical lens 120 having a planar interface 122 is affixed adjacent the first major surface 112 using an encapsulant 130, such that blue-light emitted from the LED 140 enters the hemispherical lens 120 through the planar interface 122. A first, a second, and a third input blue-light rays 141, 143, 145 are shown propagating within the hemispherical lens 120, are reflected from a dichroic reflector 160 disposed on the hemispherical outer surface 124, and are re-directed toward the phosphor layer 150 as a fourth, a fifth, and a sixth reflected blue-light rays 142, 144, 146. It is to be understood that the directionality of each of the light rays described can be reversed for the re-emission of the downconverted light from the phosphor layer.

Dichroic reflector 160, also sometimes referred to as a dichroic mirror, is a reflector designed to have a high reflectivity (and low transmission) for some optical wavelengths, and a low reflectivity (and high transmission) for other optical wavelengths. Such reflectors ordinarily have negligible absorption, such that any light that is not reflected is substantially transmitted, and vice versa, at least over visible and near infrared wavelengths. Such reflectors comprise stacks of optically thin microlayers, typically in an alternating arrangement of materials having a large refractive index mismatch, such as alternating layers of silicon dioxide and titanium dioxide, but other suitable inorganic or organic materials may also be used. Such reflectors may be made by vacuum deposition of the alternating layers on a glass or other suitable substrate. Alternatively, suitable reflective films may be made by a continuous process that may involve coextrusion of alternating polymer materials and stretching the resulting multilayer polymer web, e.g. as described in U.S. Pat. Nos. 5,882,774 and 6,783,349. Regardless of the materials used in the dichroic reflector and the method of manufacture used, the reflector is provided with a layer thickness profile for the stack of microlayers that is tailored to provide the desired reflection characteristics as a function of wavelength, as described elsewhere herein. Reference in this regard is made to U.S. Pat. No. 6,967,778. The thickness profile may be tailored to provide a dichroic reflector that operates as a long pass filter or a notch filter, for example. In some cases the dichroic reflector may be or comprise a multilayer mirror film, a reflective polarizer, and/or a partially polarizing reflector such as a mirror that, at a given wavelength, reflects all of one polarization of light and partially reflects the orthogonal polarization.

The dichroic reflector 160 can be tailored to reflect a first portion of the blue LED light, and transmit a substantially complementary second portion of the blue LED light. The dichroic reflector 160 is also shaped or otherwise configured to direct the reflected blue light 142, 144, 146 onto the phosphor layer 150. For example, as shown in the figure, the dichroic reflector may have a convex shape that opens toward or encompasses the LED and phosphor. The convex shape may be a simple hemisphere or other portion of a sphere, or it may be parabolic, elliptical, or any other regular or irregular aspheric shape, or it may be piecewise hemispherical or aspheric, for example by being made of a plurality of small or large flat facets that are arranged to approximate a desired smooth shape. In some cases the dichroic reflector may be applied, e.g. as a thin film, to an inner (not shown), outer (shown as hemispherical outer surface 124), or embedded (not shown) surface of another component. For example, in the case of remote phosphor LED device 100, the hemispherical lens 120 may comprise a suitable light-transmissive glass or polymer material that encapsulates the LED and the phosphor, and the dichroic reflector may be applied to the outer surface of such an encapsulant as shown. The encapsulant may not only provide structural integrity and robustness to the light source design, but it may also improve the efficiency of the light source by reducing the amount of light trapped by total internal reflection inside the LED die.

In exemplary embodiments the dichroic reflector may be tailored to reflect an amount ranging from 50 to 95% of the blue light from the LED, and to transmit the remainder of such light. Exemplary dichroic reflectors may also transmit most of the longer wavelength visible light emitted by the phosphor, preferably more than 75%, 80%, 85%, or 90% of such light, for example.

The shape or other configuration of the dichroic reflector 160 is preferably tailored to direct the reflected light 142, 144, 146 from the blue-light emitting LED onto the phosphor layer 150. Preferably, the reflector directs the reflected light in such a way as to form a substantial image of the LED, or of a portion thereof, on at least a portion of the phosphor layer. An "image" in this regard need not be a high quality image in the photographic sense, but may simply be an area of increased brightness whose shape at least approximates the shape of the LED or any emitting portion(s) thereof. In a simple embodiment, the reflector 160 may have the shape of a hemisphere or other portion of a sphere, the center of curvature of which is depicted as extending from a center point 111 to an outer point 121, as shown in FIG. 1. A spherical reflective surface has a (paraxial) focal length equal to half of its radius of curvature, and an arbitrary object point in a plane that contains the center of curvature is imaged by the spherical surface to an image point that lies on the same plane, and the line segment that joins the object point to the image point is bisected by the center of curvature. In the embodiment of FIG. 1, the LED 140 is shown to be offset to the right of the center point 111, and the phosphor layer 150 is shown to be offset predominantly to the left. Even though the upper emitting surface of LED 140 may not lie precisely in a horizontal plane containing center point 111 (note that the height of LED 140 is shown exaggerated in the schematic view of the figure), in many cases it will be close enough so that a substantial image—of similar size and shape as the LED emitting surface—is formed on the opposite side of the center point 111. It is here that the phosphor layer 150 is placed so as to efficiently intercept the reflected LED light. In can be advantageous to make the phosphor layer larger than the LED or oversized relative to the LED or its image, so that as much of the reflected LED light as possible is intercepted by the phosphor.

There are advantages to keeping the LED close to the center point 111, and close to the optical axis of the light source (which in the present case is an axis perpendicular to substrate 110 and passing through center point 111). By keeping the LED and its image close to the optical axis, the output light can be better collimated, and can have a lower etendue. If multiple LEDs are used, lower etendues can generally be achieved by positioning each LED as close to the optical axis as possible, without obstructing the images of other LEDs. Heat management may also play a role in determining the optimal placement of multiple LEDs, since closely spaced LEDs may result in higher operating temperatures, which may detrimentally affect the output power of the LEDs.

In addition to being disposed on opposite sides of the center point 111, it is usually advantageous to position the LED and phosphor layer so that they are generally co-planar. "Co-planar" in this regard does not require a given surface of the LED to be located in precisely the same geometric plane as a surface of the phosphor layer, or vice versa, but can also be understood to include cases where the components are close enough to the same plane so that the phosphor layer intercepts all, or at least a substantial portion, of the reflected light from the LED.

A significant design feature of the remote phosphor LED device 100, and of other light sources disclosed herein, is that as light travels from the LED to the dichroic reflector, it does not pass through the phosphor layer 150. This design feature differs from the design of many LED-pumped phosphor sources in which light from the LED passes through the phosphor layer before impinging upon any reflector of LED light. A significant benefit of the disclosed designs is that the side or surface of the phosphor layer that is initially impinged upon by the reflected LED light is also the side or surface of the phosphor layer that faces toward the output of the light source. Stated differently, with reference to FIG. 1, reflected light from the LED initially impinges upon the upper surface of phosphor layer 150, which upper surface faces upward or outward towards the output of the remote phosphor LED device 100. The reflected LED light penetrates to some extent into the phosphor layer 150, depending on the amount of absorption and scattering in that layer, but in any case the intensity of such light diminishes with increasing depth below the upper surface. As a result, the intensity of fluorescent light that is generated in the volume of the phosphor layer 150 is brightest at the upper surface, and diminishes with increasing depth below that surface. Such an arrangement can provide reduced absorption and scattering of LED light and phosphor light, and enhanced overall efficiency for the light source.

In some cases, the physical thickness and absorption coefficient of the phosphor layer 150 at the wavelength(s) of the LED light may be tailored such that substantially all of the LED light that impinges upon the phosphor layer is absorbed or otherwise scattered such that substantially none reaches the rear or back surface of the phosphor layer, which surface may be in contact with the substrate 110.

In other cases, the physical thickness of the phosphor layer may be reduced, and/or its absorption coefficient at the LED wavelength(s) reduced, such that a substantial portion of the impinging LED light may reach the back or rear surface of the phosphor layer. In these latter cases, the first major surface 112 may be a reflective surface 112 that may be provided at the back surface of the phosphor layer 150 to allow the remaining LED light to propagate again through the thickness of the phosphor layer so as to generate more fluorescent light. Embodiments utilizing a reduced thickness phosphor layer are generally advantageous from a heat management standpoint, because the reduced thickness of the phosphor layer can be used to increase the typically poor thermal coupling of upper portions of the phosphor layer to an underlying heat sink. Phosphor layers typically have dramatically lower thermal conductivities than LEDs, and any design techniques that can help draw heat away from the phosphor layer can advantageously help to lower the operating temperature of the phosphor.

As explained elsewhere herein, the phosphor material, i.e. the light conversion material, emits light of generally longer wavelength than that of the LED by absorbing the LED light and emitting the absorbed energy as lower energy (longer wavelength) radiation. The light conversion process involves loss associated with the Stokes shift to the lower energies as well as nonradiative losses, all of these losses typically manifesting themselves as heat generated in the phosphor layer. Exemplary phosphor materials absorb blue light, e.g., light in a wavelength range from about 430-470 nm, and provide fluorescent emission in lower energy portions of the visible spectrum, e.g., in the range from 500-700 nm. An exemplary phosphor material is cerium-doped yttrium aluminum garnet (Ce:YAG). Other suitable phosphor materials include other known types of doped YAG, orthosilicate, nitride, or sulfide materials. In some cases the phosphor layer or material may comprise a mixture of one or more types of phosphor particles in a suitable binder material. The dichroic reflector 160 is tailored to substantially transmit light of the longer visible wavelength light emitted by the phosphor layer.

Any suitable substrate may be used as substrate 110 to carry the LED 140 and phosphor layer 150. The substrate may include conductive layers or traces to carry electrical power to the LED. The substrate also preferably has a relatively high heat conduction and relatively low thermal resistance in order to effectively carry heat away from the LED and/or phosphor layer so as to maintain lower operating temperatures thereof. To promote such lower operating temperatures, the substrate may include or be thermally coupled to a suitable heat sink, e.g., a relatively thick layer of copper, aluminum, or other suitable metal or other thermally conductive material. In some cases the substrate may be or comprise a highly reflective surface such as a metal mirror, a metal mirror with dielectric coatings to enhance reflectivity, or a diffusely reflective surface such as microvoided polyester or titania filled polymer, or a multilayer optical film such as 3M™ Vikuiti™ Enhanced Specular Reflector (ESR) film. The substrate may also be or comprise any of the substrates discussed elsewhere herein.

Figure 1B:
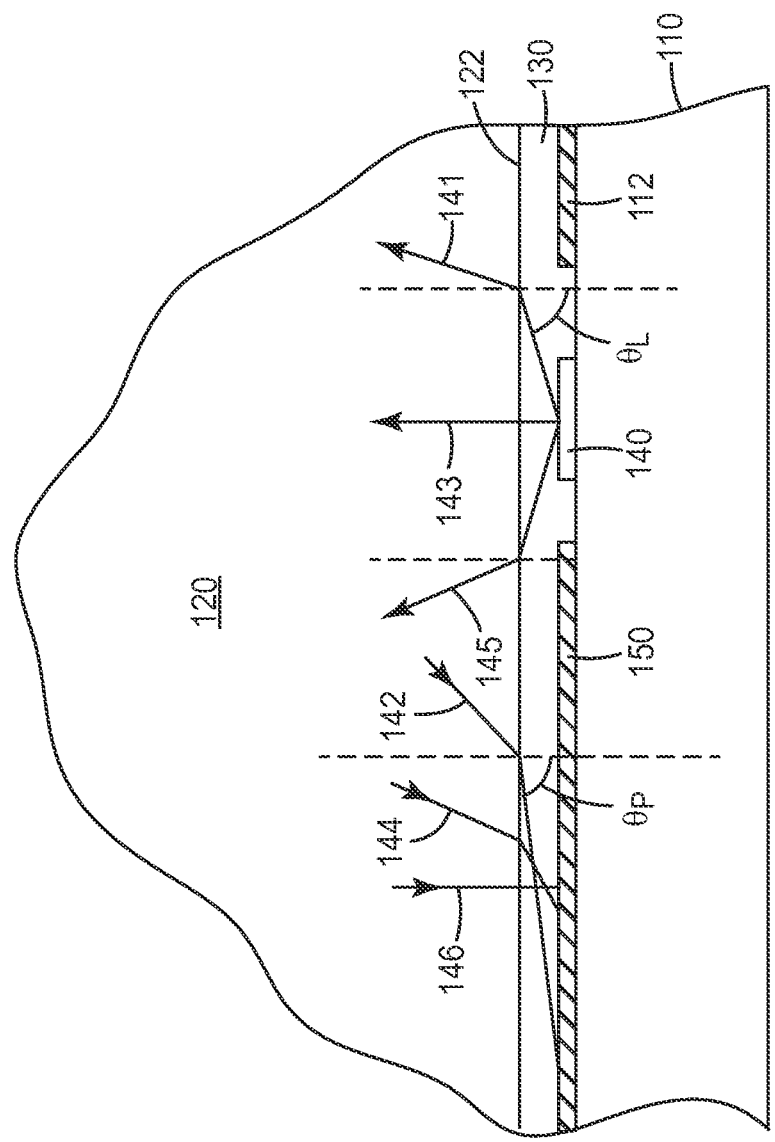
FIG. 1B shows a schematic cross-sectional view of a portion of the prior art remote phosphor LED device of FIG. 1A, proximate an LED.

FIG. 1B shows a schematic cross-sectional view of a portion of the prior art remote phosphor LED 100 device of FIG. 1A, proximate an LED 140, showing light paths through the encapsulant layer 130 and the hemispherical lens 120. LED 140 disposed on substrate 110, emits light rays, such as, for example, blue-light rays 141, 143, and 145 in a generally lambertian distribution. As such, an LED incidence angle $\theta_L$ at the planar interface 122 between the encapsulant layer 130 and the hemispherical lens 120, ranges from a grazing incidence of +/−90 degrees (i.e., parallel to the interface) to 0 degrees (normal to the interface).

In a similar manner, rays that are reflected by the dichroic mirror 160, such as, for example fourth, a fifth, and a sixth reflected blue-light rays 142, 144, 146, return to the phosphor layer 150 in a distribution having a wide variation of incidence angles. As such, a phosphor incidence angle $\theta_P$ at the interface between the encapsulant layer 130 and the hemispherical lens 120, ranges from a grazing incidence of +/−90 degrees (i.e., parallel to the interface) to 0 degrees (normal to the interface). Further still, rays that are down-converted and subsequently re-emitted by the phosphor layer 150, can also re-enter the planar interface 122 at angles between grazing incidence and normal. Depending on the relative magnitude of the refractive index of the encapsulant 130 and the hemispherical lens 120, light rays may interact at greater than the critical angle for the planar interface 122, and may undergo total internal reflection (TIR), thereby lowering the efficiency of light emitted by the prior art remote phosphor LED 100.

Figure 2A:
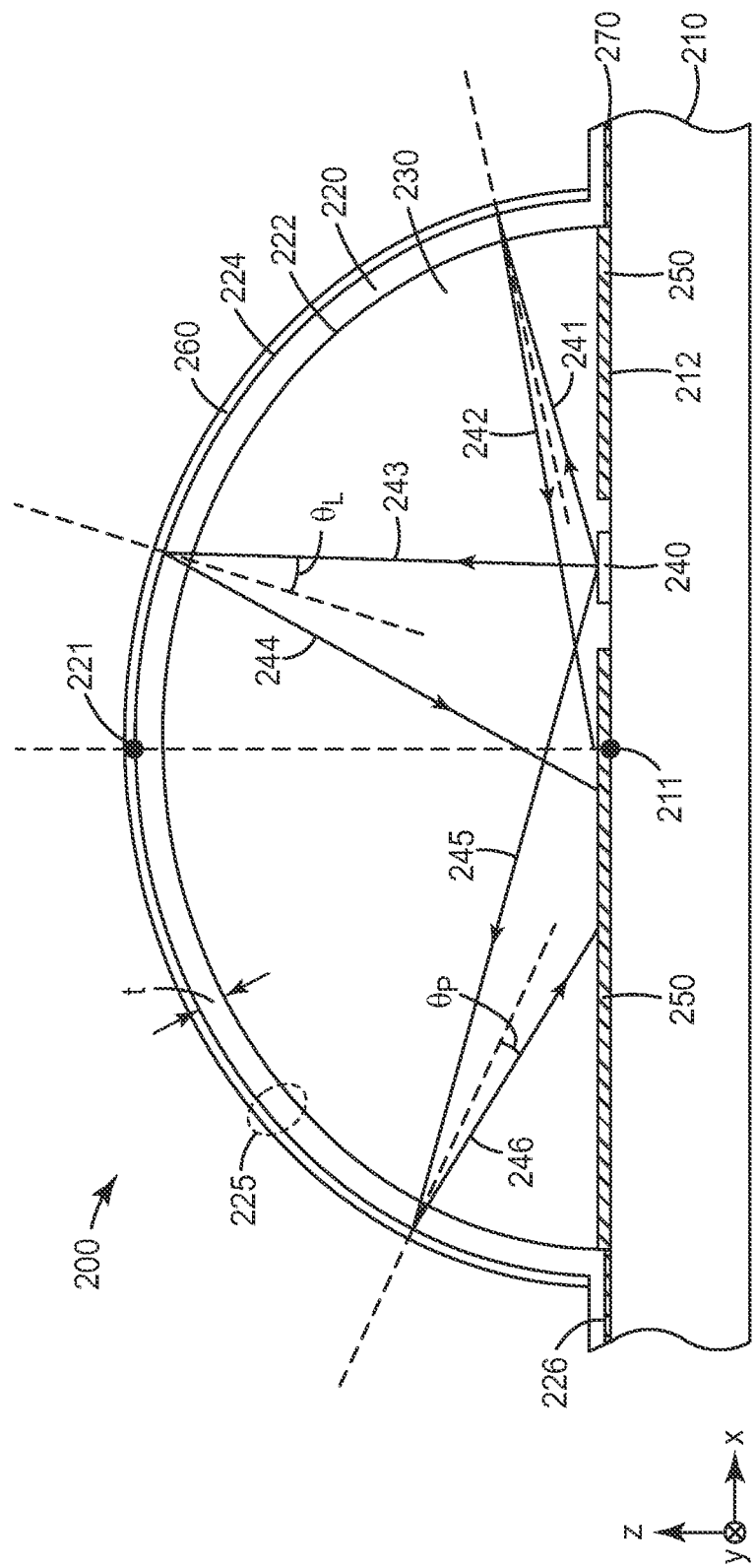
FIG. 2A shows a schematic cross-sectional view of a remote phosphor LED device.

FIG. 2A shows a schematic cross-sectional view of a remote phosphor LED device 200, according to one aspect of the disclosure. Each of the elements 210-260 shown in FIG. 2A correspond to like-numbered elements 110-160 shown in FIG. 1A, which have been described previously. For example, substrate 210 shown in FIG. 2A corresponds to substrate 110 shown in FIG. 1A, and so on. In FIG. 2A, the prior art planar interface 122 of FIG. 1A has been replaced by an interior concave surface 222 of a light transmissive shell 220. The interior concave surface 222 forms a novel interface that the inventors have discovered to provide surprising benefits in both efficiency and color purity of the novel remote phosphor LED device 200 having a light transmissive shell 220.

The remote phosphor LED device 200 includes a blue-light emitting LED 240 and a phosphor layer 250 disposed on a first major surface 212 of a substrate 210. In one particular embodiment, the blue-light emitting LED 240 can also be an ultraviolet light emitting LED, as described elsewhere. The light transmissive shell 220 having the interior concave surface 222, an exterior convex surface 224, a thickness "t", and a edge 226, and is affixed adjacent the first major surface 212 using an adhesive layer 270. A volume 230 between the interior concave surface 222 of the light transmissive shell 220 and first major surface 212 can be filled with an encapsulant. The encapsulant can have an index of refraction generally not greater than about 1.5, and can comprise a gas, a mixture of gasses, an epoxy, a silicone, or a combination thereof. In one particular embodiment, the encapsulant can comprise methyl silicone.

Blue-light emitted from the LED 240 enters the volume 230 between the interior concave surface 222 of the light transmissive shell 220 and the first major surface 212 of the substrate 210, and is directed through the encapsulant to a partially reflective shell 225 that includes the light transmissive shell 220 and a dichroic reflector 260 disposed on the exterior convex surface 224. A first, a second, and a third input blue-light rays 241, 243, 245 shown propagating within the volume 230, are reflected from the dichroic reflector 260 disposed on the exterior convex surface 224, and are re-directed toward the phosphor layer 250 as a fourth, a fifth, and a sixth reflected blue-light rays 242, 244, 246.

Figure 2B:
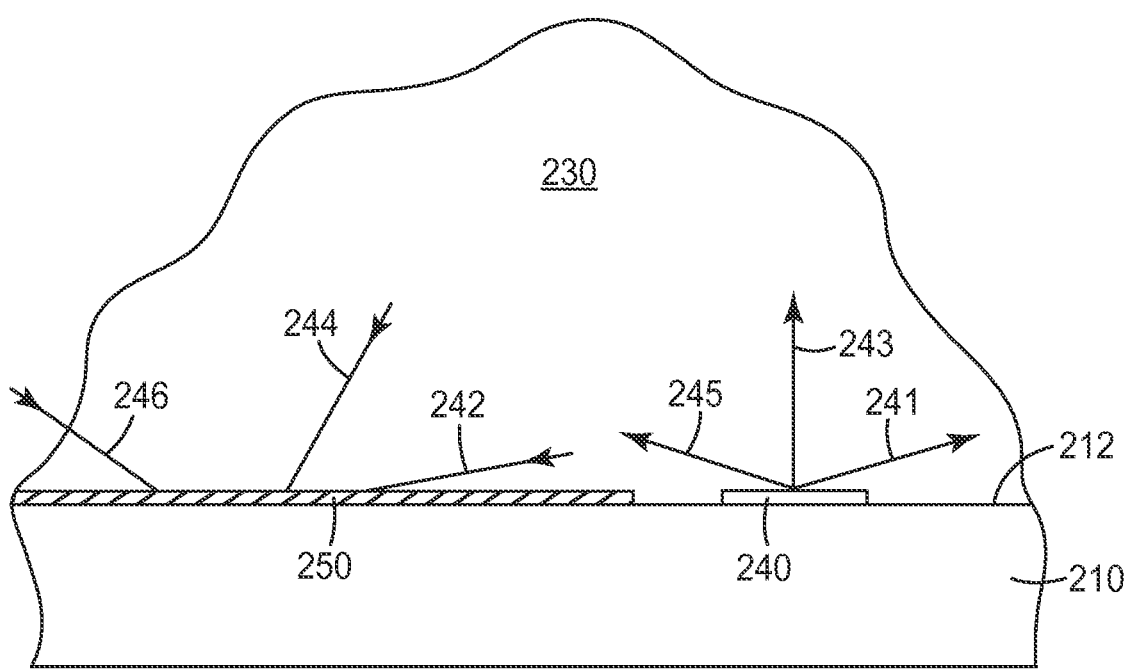
FIG. 2B shows a schematic cross-sectional view of a portion of the remote phosphor LED device of FIG. 2A, proximate an LED.

FIG. 2B shows a schematic cross-sectional view of a portion of the remote phosphor LED device 200 of FIG. 2A, proximate an LED 240, according to one aspect of the disclosure. LED 240 disposed on substrate 210, emits light rays, such as, for example, blue-light rays 241, 243, and 245 through encapsulant in volume 230, in a generally lambertian distribution toward partially reflective shell 225 as shown in FIG. 2A. In a similar manner, rays that are reflected by the dichroic reflector 260 of partially reflective shell 225, such as, for example fourth, a fifth, and a sixth reflected blue-light rays 242, 244, 246, return to the phosphor layer 150 in a distribution having a wide variation in incidence angles.

Figure 2C:
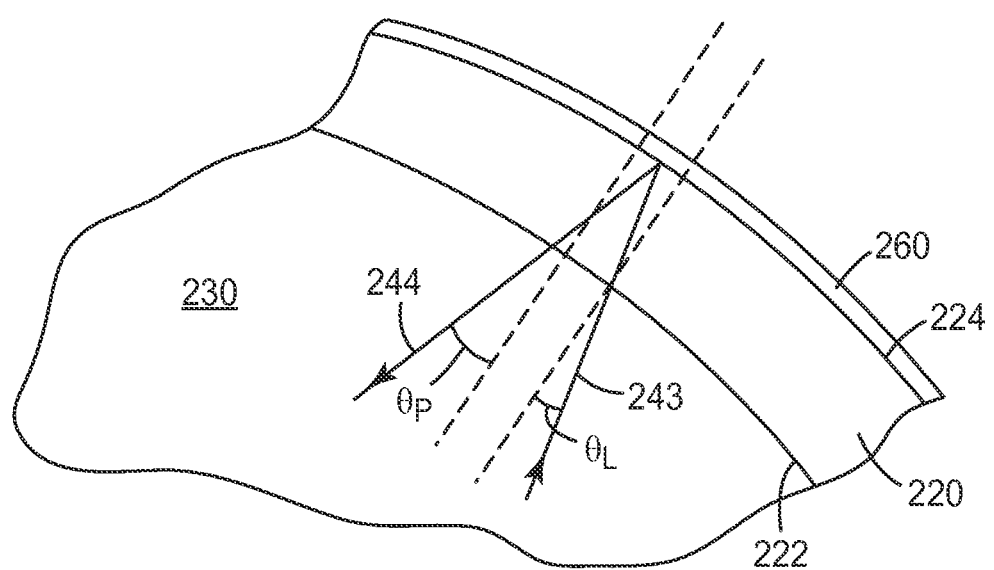
FIG. 2C shows a schematic cross-sectional view of a portion of the remote phosphor LED device of FIG. 1A, proximate a partially reflective shell.

An LED incidence angle $\theta_L$ measured separately between the normal to interior concave surface 222 of light transmissive shell 220 and the first, second, and third input blue-light rays, ranges over a much smaller range of angles than that shown with reference to FIGS. 1A and 1B. In one particular embodiment, the range of angles can be reduced to a range of incidence angles between about 0 degrees and about 65 degrees, or between about 0 degrees and about 40 degrees, or between about 0 degrees and about 30 degrees. This reduction in incidence angles is due to the presence of the interior concave surface 222 of FIG. 2A, as opposed to the planar interface 122 of FIG. 1B. FIG. 2C shows a schematic cross-sectional view of a portion of the remote phosphor LED device 200 of FIG. 2A, proximate the partially reflective shell 225 and showing a close-up view, according to one aspect of the disclosure.

In FIG. 2C, the second blue-light ray 243, for example, travels through volume 230 filled with an encapsulant, and intercepts the interior concave surface 222 of light transmissive shell 220 at the LED incident angle $\theta_L$, and refracts into the light transmissive shell 220. The LED incident angle $\theta_L$ is generally much smaller than the critical angle for TIR, and depends on the relative refractive index of the encapsulant material filling the volume 230 and the material comprising the light transmissive shell 220. The second blue-light ray 243 then reflects from dichroic reflector 260 and re-enters volume 230 at the phosphor incident angle $\theta_P$, after refraction at the interior concave surface 222.

Figure 3:
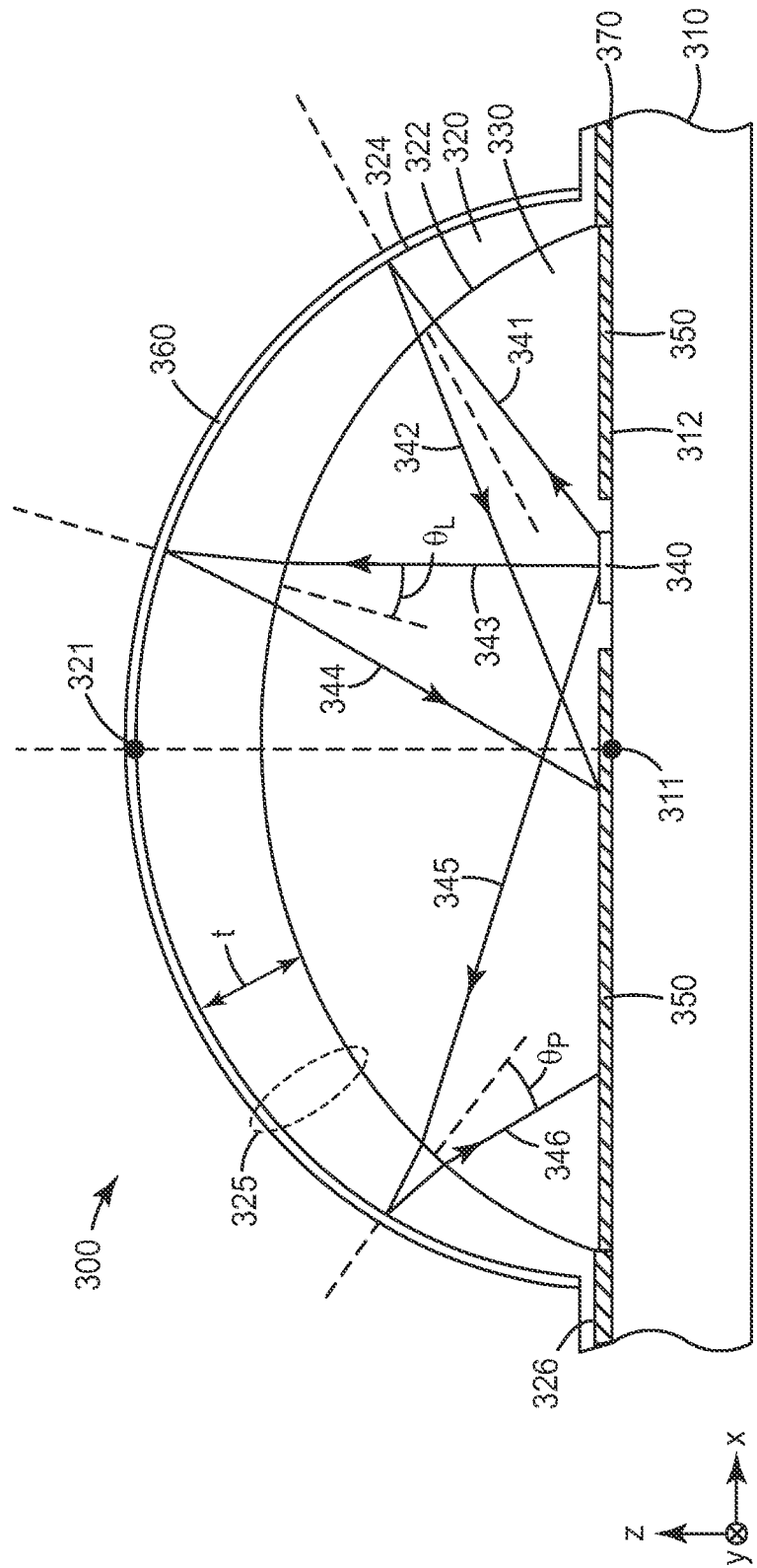
FIG. 3 shows a schematic cross-sectional view of a remote phosphor LED device.

FIG. 3 shows a schematic cross-sectional view of a remote phosphor LED device 300, according to one aspect of the disclosure. Each of the elements 310-360 shown in FIG. 3 correspond to like-numbered elements 210-260 shown in FIG. 2A, which have been described previously. For example, substrate 310 shown in FIG. 3 corresponds to substrate 210 shown in FIG. 2A, and so on. In FIG. 3, the prior art planar interface 122 of FIG. 1A has been replaced by an interior concave surface 322 of a light transmissive shell 320. The interior concave surface 322 forms a novel interface that the inventors have discovered to provide surprising benefits in both efficiency and color purity of the novel remote phosphor LED device 300 having a light transmissive shell 320. The light transmissive shell 320 of FIG. 3 is different from the light transmissive shell 220 of FIG. 2A, due primarily to a thickness "t" that varies depending on angular position relative to the horizontal, and demonstrates that the varying thickness still provides an interior concave surface 322 that can serve to reduce the range of LED incidence angle $\theta_L$. In one particular embodiment, the variation in the thickness can result in further collimation of light emitted from the remote phosphor LED device 300.

Figure 4:
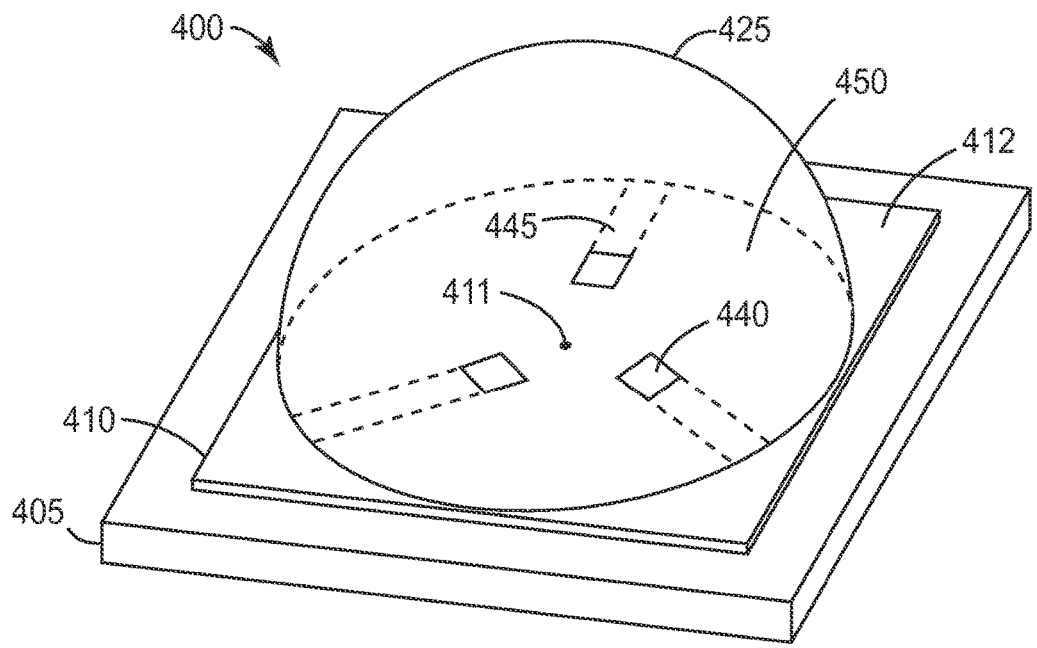
FIG. 4 shows a schematic perspective view of a remote phosphor LED lamp.

FIG. 4 shows a schematic perspective view of a remote phosphor LED lamp 400, according to one aspect of the disclosure. The lamp 400 includes three blue-light emitting LEDs 440 disposed on a thermal management substrate 405, the thermal management substrate 405 also having thereon a substrate 410 that includes a first major surface 412 that may be a reflective surface. A phosphor layer 450 is disposed on the first major surface 412 and is at least partially contained within partially transparent shell 425 that includes a light transmissive shell and a dichroic reflector, as described elsewhere. The phosphor layer 450 emits longer wavelength visible light when exposed to the blue light from the LEDs 440. The LEDs 440 preferably emit the same color of blue light, i.e., they have the same or similar emission spectra. The LEDs 440 may also have the same size and shape, although this is not necessary, and LEDs 440 having different sizes and shapes are also contemplated, as well as LEDs 440 that have somewhat different emission spectra of blue light. Any desired number of LEDs 440 can be included in lamp 400.

The center of the disk-shaped phosphor layer 450 within the partially reflective shell 425 is marked by a point 411, which also generally corresponds to the center of curvature for the partially reflective shell 425. The LEDs 440 are positioned relatively close to the point 411, and can generally be positioned at equivalent locations around the disk-shaped phosphor layer 450, although this may not be required. Generally, the LEDs 440 are arranged along orthogonal in-plane axes such that no individual LED obstructs the image of the other LED that is formed by the partially reflective shell 425. Each of the LEDs 440 further includes a region 445 that may include, for example, electrical connections and/or circuits for operation of the lamp 400.

Figure 5:
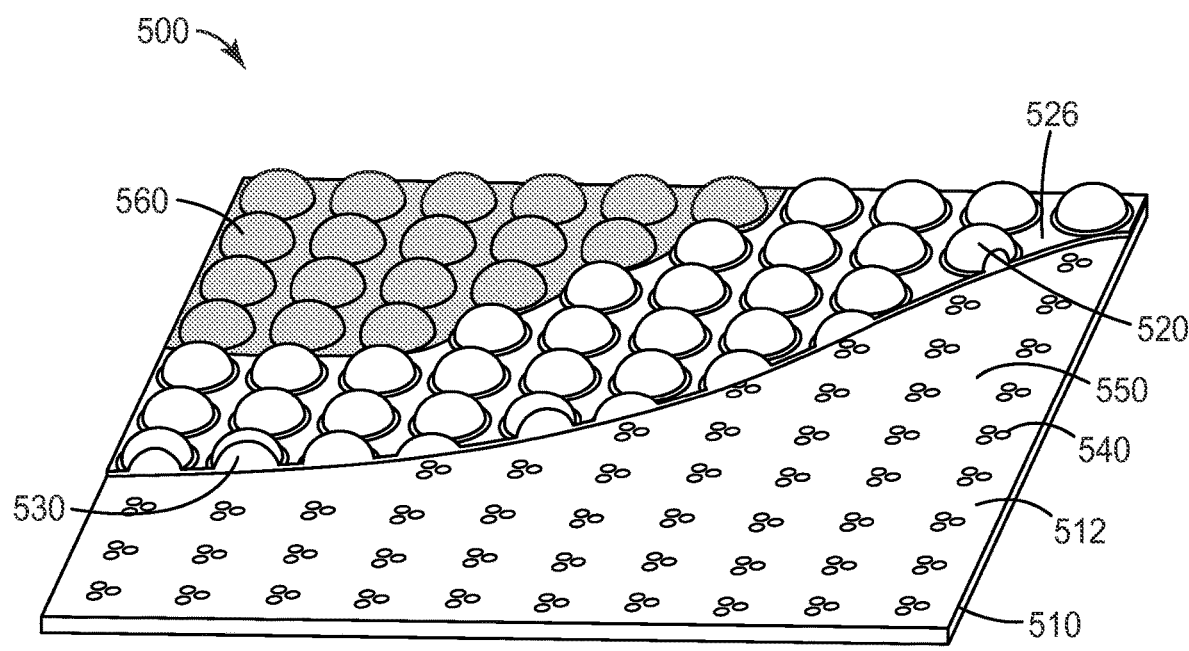
FIG. 5 shows a schematic perspective view of an array of remote phosphor LED lamps.

FIG. 5 shows a schematic perspective view of an array of remote phosphor LED lamps 500, according to one aspect of the disclosure. Substrate 510, which can be a circuit board, includes an array of LEDs 540 disposed on first major surface 512 of substrate 510. In one particular embodiment as shown in FIG. 5, the array of LEDs 540 includes groupings of three LEDs that are grouped together in a manner similar to that shown in FIG. 4. A phosphor layer 550 is disposed on the first major surface 512, and an array of light transmissive shells 520 separated by flat edge regions 526 is disposed over the substrate 510 such that each grouping of LEDs 540 is contained in a volume 530 within a light transmissive shell 520. The volume 530 can be filled with an encapsulant, and a dichroic reflector 560 is coated on the exterior convex surface (alternately on the interior concave surface, not shown here) of each light transmissive shell 520, as described elsewhere.

It is to be understood that the array of remote phosphor LED lamps can have any desired shape or configuration, although a rectangular array is depicted in FIG. 5, and the number of lenses within an array can vary from a singular lens, to hundreds of lenses. The limitations on the size of the array relate primarily to any thermal mismatch between the lens array and the LED circuit board and/or substrate materials. The potential thermal mismatch will be described in further detail below as a particular advantage of this invention. Another advantage is the flexibility in encapsulant choices, or lack of encapsulant, which will also be described in further detail. The lens array can be advantageous for LED lamps and luminaires which have LEDs configured in an array. Some examples of such arrays may include, for example, a circular array.

The LED system works as follows. Light is emitted from the LEDs which emits light within a range of wavelengths. In the case of a blue LED, this is generally in the range of 420-490 nm. The dichroic coating on the lens reflects most of the lower wavelengths from the LED and allows the longer wavelengths through the lens. The reflected light is directed by the shape of the lens towards the phosphor patches which are under each lens, adjacent to the LEDs, and positioned to receive the reflected light. The phosphor converts the LED light and emits a second color above 490 nm, typically 500-650 nm. The dichroic lens allows the converted light to pass through. Light output color and spectrum can be achieved by proper selection of phosphors, LEDs, and dichroic coating designs. For lighting applications, the goal is generally a white light with color temperature between 2700 and 5700K, and with CRI exceeding 90, but many different light outputs can be designed by varying components, including but not limited to phosphor, dichroic coating, LED and encapsulant.

While the present invention will work on matrix-shaped arrays, the internal stresses on the glass may make these more prone to breakage along the linear attachments between the lenses. In some cases, a preferred embodiment (from a robustness aspect) would minimize breakage by having staggered LEDs. The glass shell lens array can be placed on a circuit board, and attached either be by the encapsulant, or may be attached by sealing the edges with an adhesive, including but not limited to sealants and epoxies. If sealants are used along the edges of the array, the domes may be filled with inert gas, terrestrial air, or other gas, or may have an optical gel.

Because the coefficient of thermal expansion (CTE) of the glass may be different from CTE of the circuit board material, the heat generated by the LEDs preferably does not impact a CTE mismatch which results in breakage of the lens, or result in misalignment of the lens with respect to the LEDs. The configuration of the lens array can be designed to minimize generated stress levels and also to determine the maximum size of a lens array for given circuit board materials and thermal levels.

The stress in thin glass components such as the array of partially transmissive shells has been modeled, for a lens array attached to an aluminum substrate with a silicone encapsulant, one narrow edge of the aluminum substrate is fixed, and the other surfaces are allowed to float. The system temperature was modeled to be increased from 25° C. to 100° C., and the stress in the borosilicate glass was shown to be significantly less than its tensile strength. Even in cases where the glass does break, the encapsulant, if used, and remaining glass structure, will retain the basic geometry of the lens, and the remote phosphor will continue to operate.

Another issue that was considered was the shift of the LEDs relative to array domes, as the glass array might expand at a different rate than the aluminum. Generally, the aluminum and the glass array expansion have an acceptable match, assuring that light color won't shift at the edges as the system heats up.

Other materials may be used for the substrate, including ceramics, fiberglass materials, and the like. In some cases, if stress is seen to be a problem through CTE mismatch or through attachment systems, it is possible to size the array so that it is not an issue, in which case a tile of glass shell arrays can make up the complete LED array size. Alternately, the glass shells can be individual hollow lenses and attached individually. In some cases, this configuration may be advantageous in other ways: it is an easier replacement for current solid lens systems, and breakage of one lens will be even less likely to affect other lenses.

The advantages of the array include lower costs of manufacturing and assembling the array. Only one piece needs to be positioned, and the array can be secured to the circuit board either through encapsulant in each hollow dome and/or under the flat portions of the glass, or may be secured at the edges. The array as depicted in, for example, FIG. 5 is shown to be flat, but the array can also be made on curved surfaces or other desired shapes to match a curved or shaped substrate.

The encapsulant is often included in LED lighting systems to protect the LED, and to attach the lens above the surface of the LED and onto the circuit board. The encapsulant may be one of several types, including but not limited to methyl silicone, phenyl silicone, epoxies, and the like, as known to those of skill in the art. A material with optical clarity, long life, and a refractive index near that of the LED for more efficient out-coupling of light is desired. Further, the ability to withstand heat and exposure to light without yellowing is desirable, particularly for lighting applications where the device may be in use for years or even decades. Phenyl silicone is the current silicone of choice when light efficiency is a primary consideration. Phenyl silicone has a refractive index of 1.48-1.54, but yellowing can be as high as 4-5% if exposed below 400 nm for 1000 hrs, which can be undesirable for lighting having a lifetime of years or decades.

In one particular embodiment, a methyl silicone encapsulant may be preferred when lifetime is a primary issue. The methyl silicone is less likely to yellow over time and exposure to light, but the refractive index is lower (typically 1.40-1.43) and so mismatch to glass is greater. The refractive index mismatch can result in color shift over angle due to total internal reflection at some angles at the encapsulant/glass interface, or at the encapsulant/phosphor matrix interface if the encapsulant is separate from the phosphor matrix. However, the present invention allows methyl silicone to be used without large color shift over angle. When a hollow meniscus shell is used, the light from the LED moves through the encapsulant or air, to hit the meniscus surfaces at oblique angles with little or no TIR.

EXAMPLES

The relative color shift variation due to intercept angle was determined for prior art solid hemispherical lenses (i.e., similar to that shown in FIG. 1A), and for hemispherical shell lenses according to one particular embodiment of the present invention (i.e., similar to that shown in FIG. 2A). The CIE 1976 UCS is commonly used to quantify differences in color, because the Euclidean distance between any two points is approximately representative of the magnitude of the perceived color difference. This color difference can be expressed as d(u',v') or simply du'v':

$$d(u',v') = \sqrt{(u'_1 - u'_0)^2 + (v'_1 - v'_0)^2}$$

In dichroic-lens-based remote phosphor systems, the refractive index of the phosphor encapsulant and the lens adhesive will have effects that depend on the geometry of the remote phosphor lens. For example, the predominantly flat interface of a solid glass lens will behave differently than the highly curved interface of a hollow glass shell.

A series of LightTools simulations were performed to quantify the sensitivity of two families of exemplary remote phosphor optics assemblies with varying parameters. One family included a solid glass lens in the form of a truncated hemisphere (similar to the remote phosphor LED device 100 shown in FIG. 1A), and the other family included a hollow glass shell (similar to the remote phosphor LED device 200 shown in FIG. 2A) with otherwise similar dimensions. The outer diameter of the lens was 10 mm, and the lens was truncated such that the distance between the substrate and the exterior convex surface (i.e., the separation between points 111 and 121 in FIG. 1A, or the separation between points 211 and 221 in FIG. 2A) was 10% less than the radius of the lens (i.e., for the 10 mm diameter lens, points 121, 221 were 4.5 mm above the substrate first major surface 112, 212, respectively). For the shell, the inner diameter was 9 mm (i.e., the inner concave surface was such that the shell thickness "t" was 0.05 mm)

Each simulation included 25 million rays traced using LightTools, with a 101×51 element intensity mesh. A blue dichroic coating was simulated with properties for a 13 layer SiO2/TiO2 stack, with each layer being between 9 nm and 97 nm in thickness. The LED peak output wavelength was 450 nm, with a FWHM of 18 nm, assuming a Gaussian distribution of emission. The LED surface reflectance was set to 80% and the LED die was square-shaped with a 1 mm edge length. The phosphor thickness was 0.1 mm, the phosphor coverage was set to 90% of the lens diameter for most simulations (reduced to 80% coverage for two of the simulations, as described elsewhere), and a gap of 0.025 mm was maintained between the LED and the phosphor. The phosphor included both a yellow- and red-downconverting phosphor; the yellow-phosphor had a concentration was 300,000 particles/mm$^2$ and the red-phosphor had a concentration of 0.1 particles/mm$^2$ (i.e., approximately zero, thereby effectively disabling the red phosphor).

Several parameters were varied during the simulations, most notably the refractive indices of the encapsulant material used for lens attach or phosphor dispersion. The lens material in the model was N-BK7 optical glass from Schott (Schott North America Inc., Elmsford N.Y., www.us.schott.com). A related glass is HK9L from CDGM (CDGM Glass Company Ltd., Chengdu, China). Methyl silicone was represented in the model by a constant refractive index of 1.42. Two representative phenyl silicones from NuSil (NuSil Techology LLC, Santa Barbara, Calif., USA, www.nusil.com) were employed in the modeling. Wavelength dependence of the index was specified via Cauchy parameters determined from datasheet values of refractive index given at 5 wavelengths and evaluated for these parameters using the following equation, where n is refractive index and λ is wavelength in micrometers:

$$n = A + \frac{B}{\lambda^2} + \frac{C}{\lambda^4}$$

The fitted Cauchy parameters used in the equation are shown in Table 1:

TABLE 1

Fitted Cauchy Parameters

| | A | B | C |
|---|---|---|---|
| Schott N-BK7 | 1.50400 | 0.0045362 | −0.000038751 |
| Methyl Silicone | 1.42000 | 0 | 0 |
| Nusil LS 3351 | 1.48784 | 0.0067288 | 0.00018163 |
| Nusil LS 3252 | 1.49642 | 0.0068576 | 0.00020551 |

The silicone and phosphor parameters were varied in raytracing simulation runs, along with other parameters as listed in Table 2.

TABLE 2

Parameters for Simulation Runs

| | Phosphor unconverted scattering | Silicone glue | Phosphor matrix | Phosphor diameter (mm) | Phosphor-lens spacing (mm) | LED-lens spacing (mm) | LED relative to phosphor surface |
|---|---|---|---|---|---|---|---|
| Run 1 | Isotropic | LS-3252 | LS-3351 | 9 | 0.050 | 0.150 | LED below |
| Run 2 | Isotropic | LS-3252 | LS-3252 | 9 | 0.050 | 0.150 | LED below |
| Run 3 | Mie (5° res.) | LS-3252 | LS-3351 | 9 | 0.050 | 0.150 | LED below |
| Run 4 | Mie (5° res.) | LS-3252 | LS-3252 | 9 | 0.050 | 0.150 | LED below |
| Run 5 | Mie (5° res.) | LS-3351 | LS-3351 | 9 | 0.050 | 0.150 | LED below |
| Run 6 | Isotropic | LS-3351 | LS-3351 | 9 | 0.050 | 0.150 | LED below |
| Run 7 | Isotropic | LS-3351 | LS-3252 | 9 | 0.050 | 0.150 | LED below |
| Run 8 | Mie (5° res.) | LS-3351 | LS-3252 | 9 | 0.050 | 0.150 | LED below |
| Run 9 | Mie (5° res.) | methyl | methyl | 9 | 0.050 | 0.150 | LED below |
| Run 10 | Isotropic | methyl | methyl | 9 | 0.050 | 0.150 | LED below |
| Run 11 | Mie (5° res.) | LS-3252 | LS-3252 | 9 | 0.025 | 0.010 | LED above |
| Run 12 | Mie (5° res.) | NBK7 | NBK7 | 9 | 0.025 | 0.010 | LED above |
| Run 13 | Mie (5° res.) | NBK7 | NBK7 | 8 | 0.025 | 0.010 | LED above |
| Run 14 | Mie (5° res.) | NBK7 | NBK7 | 9 | 0.050 | 0.150 | LED below |
| Run 15 | Isotropic | NBK7 | NBK7 | 9 | 0.025 | 0.010 | LED above |
| Run 16 | Isotropic | NBK7 | NBK7 | 9 | 0.050 | 0.150 | LED below |
| Run 17 | Mie (5° res.) | methyl | methyl | 9 | 0.025 | 0.010 | LED above |
| Run 18 | Isotropic | methyl | methyl | 9 | 0.025 | 0.010 | LED above |
| Run 19 | Mie (5° res.) | NBK7 | NBK7 | 8 | 0.050 | 0.150 | LED below |
| Run 20 | Mie (5° res.) | LS-3351 | LS-3351 | 9 | 0.025 | 0.010 | LED above |

In Table 2, the column labeled "Phosphor unconverted scattering" refers to a setting in LightTools that controls the behavior of unconverted light—blue LED light in this case—as it travels through a phosphor-containing volume; "isotropic" scatters the unconverted light isotropically and "Mie (5° res.)" scatters the unconverted light with a distribution based on the Mie Theory calculated with 5° angular resolution.

Silicone material was used in two separate places in the model; "silicone glue" is the layer that encapsulates the LEDs and phosphor film to form optical contact with the lens, and "phosphor matrix" is the encapsulant that together with the phosphor particles forms the phosphor film. Several of the runs contained NBK7 for both "silicone" materials; this artificial case was used to look at the result of perfect index matching between silicone and glass.

"Phosphor-lens spacing" and "LED-lens spacing" are the vertical distances between the bottom lens plane and the top surface of the phosphor film or LED emitters.

Figure 6:
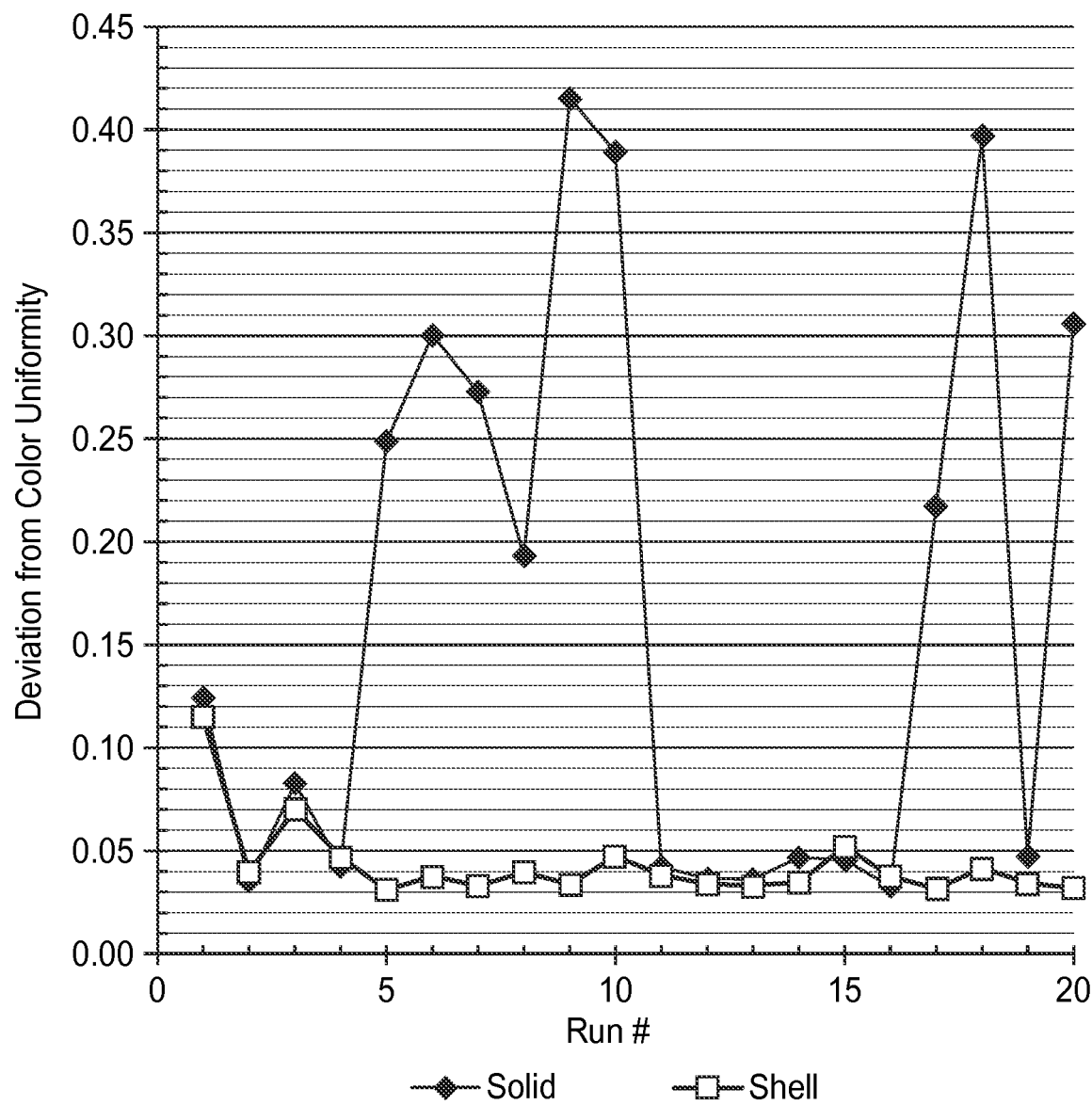
FIG. 6 shows a plot of deviation from color uniformity for remote phosphor LED devices.

Each raytracing "Run" yielded a mesh of u' and a mesh of v' color datapoints spanning a hemispherical region above the LED system, where u' and v' define a point in the CIE 1976 Uniform Chromaticity Scale. The 101×51 meshes of u' and v' obtained in each simulation case were simplified to a single result of "maximum d(u',v') from zenith u',v'" (or "Deviation from Color Uniformity") via the equation for d(u',v') given previously, where the reference point (u'0,v'0) was taken to be the chromaticity value at the zenith (directly above the system and along the z-axis, i.e., along the direction from points 111 to 121, or 211 to 221). The results are plotted in FIG. 6, which shows a plot of deviation from color uniformity for remote phosphor LED devices, (0.0 being the least deviation and therefore the most uniform color).

Large differences between solid and hollow shell lens performance are seen in runs 5-10, 17, 18, and 20, where the hollow shell construction yields clearly superior color uniformity. Referring back to Table 2, it is apparent that all of these runs (5-10, 17,18, and 20) contain methyl silicone or LS-3351 for the "silicone glue" material, which have refractive indices predominantly or entirely below the refractive indices of the lens (NBK7 glass). The hollow shell is effectively insensitive to that refractive index difference due to the highly curved interface between the lens and the silicone glue, restricting the range in angle of incidence of rays that encounter the interface.

The results also show that approximately half of the conditions yield similar color uniformity results whether using a solid hemisphere or a hollow shell, namely runs 1-4, 11-16, and 19. Referring back to Table 2, all of those runs employ LS-3252 silicone or NBK7 glass material as the "silicone glue" material, which have refractive indices that either match the glass material (NBK7) or are predominantly higher.

The effect of the material choice for the "phosphor matrix" has less impact than the choice for "silicone glue", but as one can see from Runs 1 and 3, there is a color uniformity disadvantage when the refractive indices of the silicone glue are higher than the refractive indices of the phosphor matrix. The comparisons to those runs are runs 7 and 8, where the two silicones are reversed and color uniformity is much improved.

Following are a list of embodiments of the present disclosure.

Item 1 is a lamp, comprising: a light emitting diode (LED) disposed on a substrate; a light conversion material adjacent the LED; a light transmissive shell, comprising: an exterior convex surface; an interior concave surface; an edge extending from the interior concave surface, the edge attached to the substrate and enclosing the LED and the light conversion material within a volume between the interior concave surface and the substrate; and a dichroic coating disposed on at least one of the exterior convex surface or the interior concave surface, wherein the dichroic coating is reflective to a first wavelength range of light emitted by the LED, and transmissive of other wavelength ranges of light.

Item 2 is the lamp of item 1, wherein the first wavelength range of light comprises blue-light, ultraviolet light, or a combination thereof.

Item 3 is the lamp of item 1 or item 2, wherein the light conversion material comprises a phosphor capable of down-converting the first wavelength range of light to a second wavelength range of light.

Item 4 is the lamp of item 1 to item 3, wherein the light transmissive shell comprises a hemispherical lens.

Item 5 is the lamp of item 1 to item 4, wherein the light transmissive shell comprises a glass.

Item 6 is the lamp of item 1 to item 5, wherein the edge extends between the exterior convex surface and the interior concave surface.

Item 7 is the lamp of item 1 to item 6, wherein the substrate comprises a broadband reflector.

Item 8 is the lamp of item 1 to item 7, wherein the volume between the interior concave surface and the substrate is at least partially filled with an encapsulant.

Item 9 is the lamp of item 8, wherein the encapsulant comprises a material having an index of refraction not greater than about 1.5.

Item 10 is the lamp of item 8 or item 9, wherein the encapsulant comprises a gas, a mixture of gasses, an epoxy, a silicone, or a combination thereof.

Item 11 is the lamp of item 8 to item 10, wherein the encapsulant comprises methyl silicone.

Item 12 is the lamp of item 1 to item 11, wherein the shell has a constant thickness between the interior concave surface and the exterior convex surface.

Item 13 is the lamp of item 1 to item 12, wherein angles of incidence between the interior concave surface and a light ray from the LED are less than 65 degrees from normal incidence.

Item 14 is the lamp of item 1 to item 13, wherein angles of incidence between the interior concave surface and a light ray from the LED are less than 40 degrees from normal incidence.

Item 15 is a lamp, comprising: at least two light emitting diodes (LEDs) disposed on a substrate; a light conversion material adjacent to each of the at least two LEDs; a sheet having a light transmissive shell aligned with each of the at least two LEDs, each light transmissive shell comprising: an exterior convex surface; an interior concave surface; an edge extending from the interior concave surface, the edge attached to the substrate and enclosing each LED and adjacent light conversion material within a volume between the interior concave surface and the substrate; and a dichroic coating disposed on at least one of the exterior convex surface or the interior concave surface, wherein the dichroic coating is reflective to a first wavelength range of light emitted by the LED, and transmissive of other wavelength ranges of light.

Item 16 is the lamp of item 15, wherein the at least two LEDs comprise an array of LEDs, and the sheet comprises a matching array of light transmissive shells.

Item 17 is the lamp of item 16, wherein the array comprises a linear array, a rectangular array, a circular array, a staggered array, or a combination thereof.

Item 18 is the lamp of item 15 to item 17, wherein the first wavelength range of light comprises blue-light, ultraviolet light, or a combination thereof.

Item 19 is the lamp of item 15 to item 18, wherein the light conversion material comprises a phosphor capable of down-converting first wavelength range of light to a second wavelength range of light.

Item 20 is the lamp of item 15 to item 18, wherein each light transmissive shell comprises a hemispherical lens.

Item 21 is the lamp of item 15 to item 20, wherein the sheet comprises a glass.

Item 22 is the lamp of item 15 to item 21, wherein the edge extends between adjacent light transmissive shells.

Item 23 is the lamp of item 15 to item 22, wherein the substrate comprises a broadband reflector.

Item 24 is the lamp of item 15 to item 23, wherein the volume between the interior concave surface and the substrate is at least partially filled with an encapsulant.

Item 25 is the lamp of item 24, wherein the encapsulant comprises a material having an index of refraction not greater than about 1.5.

Item 26 is the lamp of item 24 or item 25, wherein the encapsulant comprises a gas, a mixture of gasses, an epoxy, a silicone, or a combination thereof.

Item 27 is the lamp of item 24 to item 26, wherein the encapsulant comprises methyl silicone.

Item 28 is the lamp of item 15 to item 27, wherein each shell has a constant thickness between the interior concave surface and the exterior convex surface.

Item 29 is the lamp of item 15 to item 28, wherein angles of incidence between the interior concave surface and a light ray from the LED in each shell are less than 65 degrees from normal incidence.

Item 30 is the lamp of item 15 to item 29, wherein angles of incidence between the interior concave surface and a light ray from the LED in each shell are less than 40 degrees from normal incidence.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A lamp, comprising:
    at least two light emitting diodes (LEDs) disposed on a substrate;
    a light conversion material adjacent to each of the at least two LEDs;
    a glass sheet comprising a plurality of light transmissive shells, each light transmissive shell aligned with an LED in the at least two LEDs, each light transmissive shell comprising:
        an exterior convex surface;
        an interior concave surface;
        an edge extending from the interior concave surface, the edge attached to the substrate and enclosing each LED and adjacent light conversion material within a volume between the interior concave surface and the substrate, wherein the volume between the interior concave surface and the substrate is at least partially filled with an encapsulant; and
    a dichroic coating disposed on at least one of the exterior convex surface or the interior concave surface, wherein the dichroic coating is reflective to a first wavelength range of light emitted by the LED, and transmissive of other wavelength ranges of light.

2. The lamp of claim 1, wherein the at least two LEDs comprise an array of LEDs, and the sheet comprises a matching array of light transmissive shells.

3. The lamp of claim 2, wherein the array comprises a linear array, a rectangular array, a circular array, a staggered array, or a combination thereof.

4. The lamp of claim 1, wherein the light conversion material comprises a phosphor capable of down-converting the first wavelength range of light to a second wavelength range of light.

5. The lamp of claim 1, wherein the encapsulant has an index of refraction not greater than about 1.5.

6. The lamp of claim 1, wherein angles of incidence between the interior concave surface and a light ray from the LED in each shell are less than 65 degrees from normal incidence.

7. The lamp of claim 1, wherein each light transmissive shell comprises a hemispherical lens.

8. The lamp of claim 1, wherein the edge extends between adjacent light transmissive shells.

9. The lamp of claim 1, wherein the substrate comprises a broadband reflector.

10. The lamp of claim 1, wherein for each light transmissive shell, the light transmissive shell has a thickness between the exterior convex surface and the interior concave surface, the thickness varying with position and having a maximum at a center of the light transmissive shell.

11. The lamp of claim 1, wherein the encapsulant comprises methyl silicone.

* * * * *